US012587190B2

(12) United States Patent
Finn et al.

(10) Patent No.: US 12,587,190 B2
(45) Date of Patent: Mar. 24, 2026

(54) SKEW CORNER DRIVER COMPENSATION

(71) Applicant: Renesas Electronics America Inc.,
Milpitas, CA (US)

(72) Inventors: Steven Ernest Finn, Atlanta, GA (US);
Preston Blaire Sluder, Suwanee, GA
(US)

(73) Assignee: Renesas Electronics America Inc.,
Milpitas, CA (US)

( * ) Notice: Subject to any disclaimer, the term of this
patent is extended or adjusted under 35
U.S.C. 154(b) by 291 days.

(21) Appl. No.: 18/455,436

(22) Filed: Aug. 24, 2023

(65) Prior Publication Data

US 2025/0070776 A1     Feb. 27, 2025

(51) Int. Cl.
H03K 17/687 (2006.01)
H03K 17/06 (2006.01)
H03K 19/003 (2006.01)

(52) U.S. Cl.
CPC ....... H03K 17/6872 (2013.01); H03K 17/063
(2013.01); H03K 19/00315 (2013.01); *H03K
2217/0063* (2013.01); *H03K 2217/0072*
(2013.01)

(58) Field of Classification Search
CPC .................................................. H03K 17/6872
USPC .................................................. 327/108–112
See application file for complete search history.

(56) References Cited

U.S. PATENT DOCUMENTS

2023/0044791 A1*    2/2023   Ojha ...................... H02H 9/001

* cited by examiner

*Primary Examiner* — Tomi Skibinski
(74) *Attorney, Agent, or Firm* — SCULLY, SCOTT,
MURPHY & PRESSER, P.C.

(57) ABSTRACT

Systems and methods for skew compensation in a push-pull
driver are described. A device can include a first circuit
configured to output a skew measurement of an output driver
stage in a driver circuit. The device can further include a
second circuit configured to determine a first skew param-
eter based on the skew measurement and apply a first bias
that is dependent on the skew measurement to drive a
high-side transistor in the output driver stage. The device
can further include a third circuit configured to determine a
second skew parameter based on the skew measurement and
apply a second bias that is dependent on the skew measure-
ment to drive a low-side transistor in the output driver stage.
The first bias and the second bias can be complementary.

17 Claims, 6 Drawing Sheets

100

600

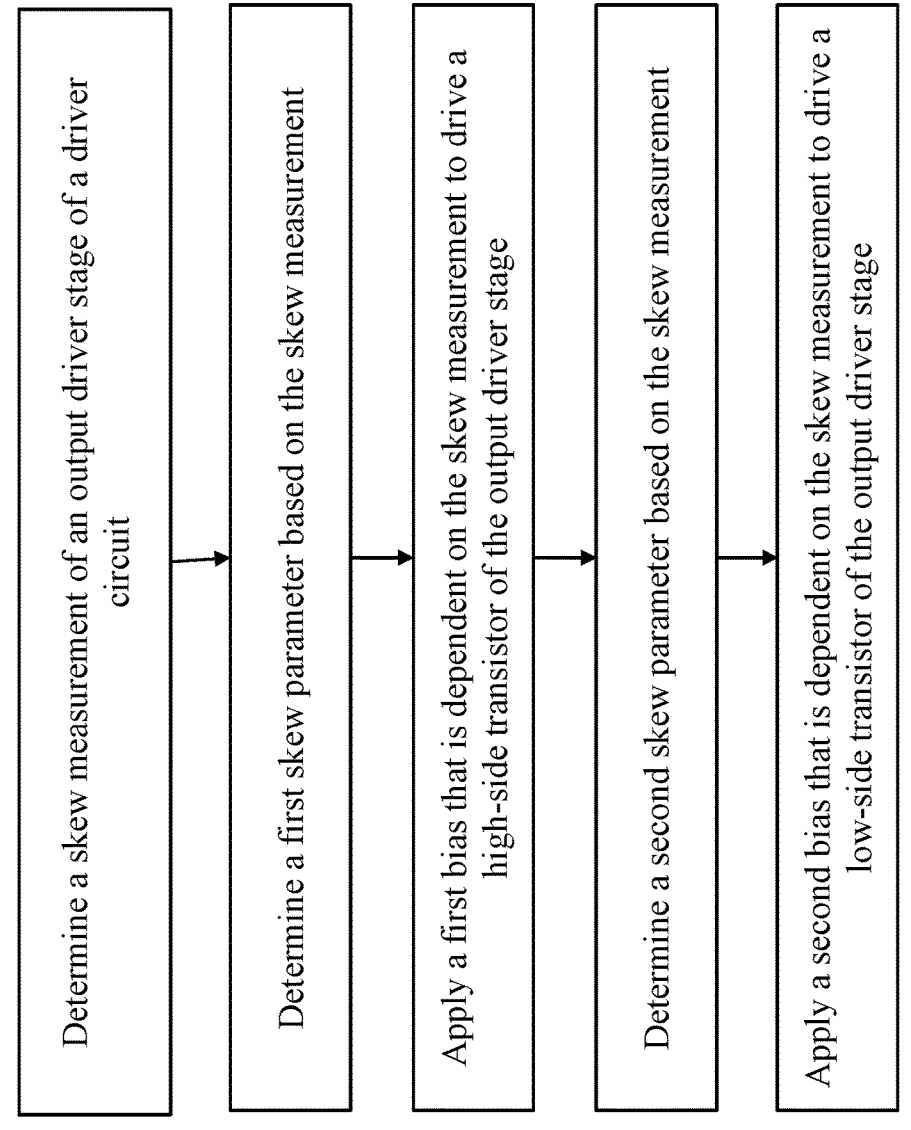

Determine a skew measurement of an output driver stage of a driver circuit

Determine a first skew parameter based on the skew measurement

Apply a first bias that is dependent on the skew measurement to drive a high-side transistor of the output driver stage Determine a second skew parameter based on the skew measurement Apply a second bias that is dependent on the skew measurement to drive a low-side transistor of the output driver stage

Fig. 6

SKEW CORNER DRIVER COMPENSATION

BACKGROUND OF THE SPECIFICATION

The present disclosure relates to a data signal driver, and more particularly, relates to skew compensation in a push-pull driver.

A data signal driver, such as a push-pull driver, can output a signal that can control two power transistors, a high-side switch and a low-side switch, to switch a direct current (DC) input voltage in alternate half-cycles in order to generate an output signal. Each power transistor can be responsible for the positive and negative half cycles of a waveform of the output signal. In operation, one power transistor can be turned on at a time. The output signal can supply current to a load (e.g., push) or can sink current from the load (e.g., pull).

SUMMARY

In one embodiment, a semiconductor device that can implement skew corner driver compensation is generally described. The semiconductor device can include a first circuit configured to output a skew measurement of an output driver stage in a driver circuit. The semiconductor device can further include a second circuit configured to determine a first skew parameter based on the skew measurement and apply a first bias that is dependent on the skew measurement to drive a high-side transistor in the output driver stage. The semiconductor device can further include a third circuit configured to determine a second skew parameter based on the skew measurement and apply a second bias that can be dependent on the skew measurement to drive a low-side transistor in the output driver stage. The first bias and the second bias can be complementary.

In one embodiment, an apparatus that can implement skew corner driver compensation is generally described. The apparatus can include a controller configured to receive an input signal. The apparatus can further include an output driver stage that can include a high-side transistor and a low-side transistor. The output driver stage can be configured to switch the high-side transistor and the low-side transistor to output an output voltage that represents the input signal. The apparatus can further include a circuit configured to determine a skew measurement of the output driver stage. The apparatus can further include a circuit configured to determine a first skew parameter based on the skew measurement. The apparatus can further include a circuit configured to apply a first bias that can be dependent on the skew measurement to drive the high-side transistor. The apparatus can further include a circuit configured to determine a second skew parameter based on the skew measurement. The apparatus can further include a circuit configured to apply a second bias that is dependent on the skew measurement to drive the low-side transistor. The first bias and the second bias can be complementary.

In one embodiment, a method for operating a driver circuit can include determining a skew measurement of an output driver stage of a driver circuit. The method can include determining a first skew parameter based on the skew measurement. The method can further include applying a first bias that can be dependent on the skew measurement to drive a high-side transistor of the output driver stage. The method can further include determining a second skew parameter based on the skew measurement. The method can further include applying a second bias that is dependent on the skew measurement to drive a low-side transistor of the output driver stage. The first bias and the second bias can be complementary.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 6 is a flowchart of an example process that can implement skew corner driver compensation in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
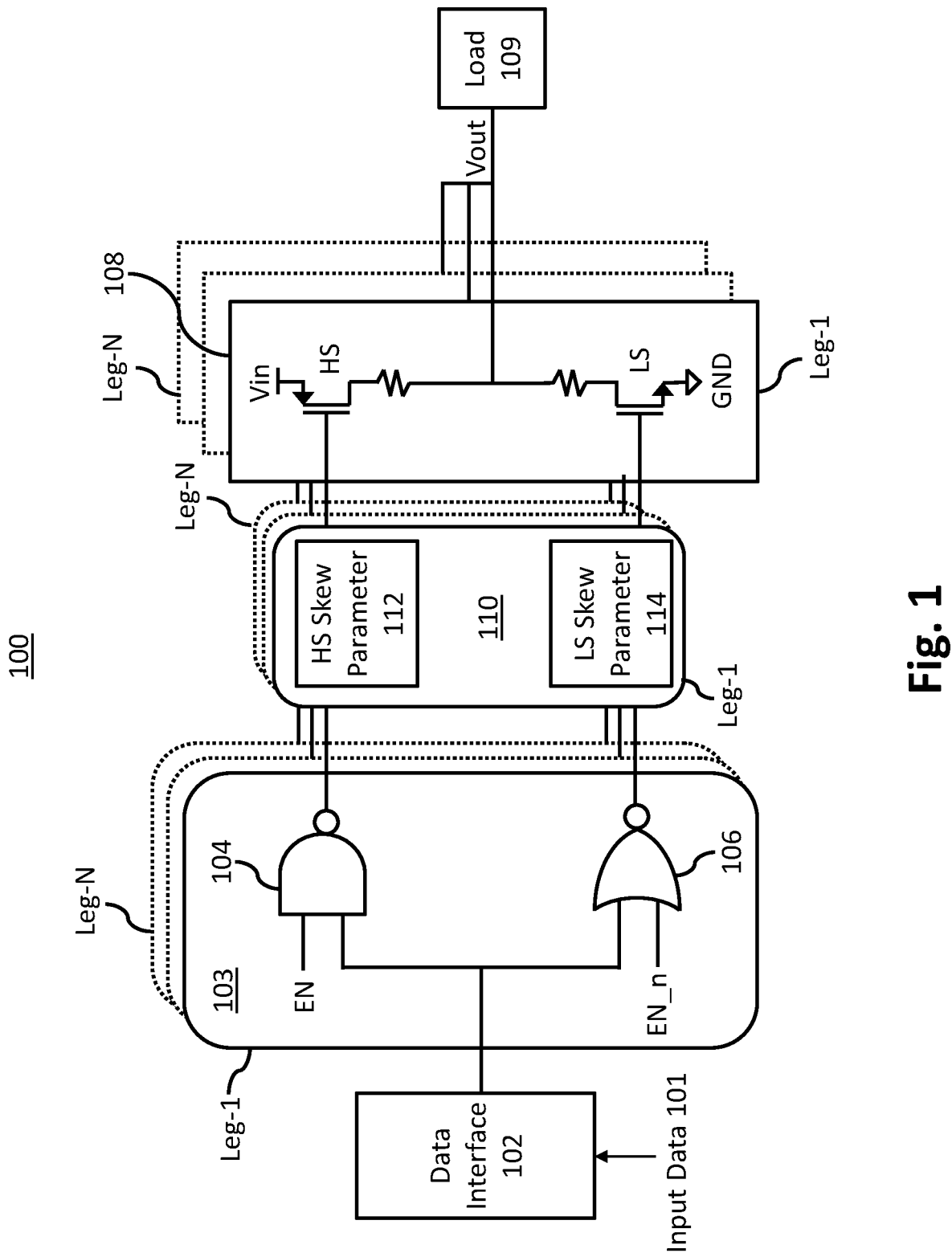
FIG. 1 is a diagram showing an apparatus that can implement skew corner driver compensation in one embodiment.

FIG. 1 is a diagram showing an apparatus that can implement skew corner driver compensation in one embodiment. An apparatus shown in FIG. 1 can be a semiconductor device implementing a driver circuit 100. In one embodiment, driver circuit 100 can be a multi-leg push-pull data driver. Driver circuit 100 can include multiple legs, such as N legs ranging from Leg-1 to Leg-N. A leg can be a section that can be configured to perform a particular task. For example, one leg can provide data and commands (e.g., in the form of voltages) to control one load of a device and another leg can provide data and commands to control another load of the device. Driver circuit 100 can be a current mode driver or a voltage mode driver.

Using Leg-1 as example, each leg can include at least a data interface 102, a controller 103, a skew correction circuit 110 and an output driver stage 108. Controller 103 can be, for example, a microcontroller including various types of hardware and circuit elements such as logic gates and other application-specific circuits. In the example shown in FIG. 1, controller 103 can include at least a NAND gate 104 and a NOR gate 106. Output driver stage 108 can include a pair of power transistors including a high-side (HS) transistor and a low-side (LS) transistor. Output driver stage 108 can further include driver circuitry configured to drive HS and LS transistors. HS transistor can be a P-type metal-oxide-semiconductor (PMOS) device such as a P-type metal-oxide-semiconductor field effect transistor (MOSFET). LS transistor can be a N-type metal-oxide-semiconductor (NMOS) device such as a N-type MOSFET.

Data interface 102 can be configured to receive input data 101 intended for load 109. Leg-1 can be configured to provide data to a load 109 in the form of output voltage Vout. Driver circuit 100 can receive input voltage Vin from, for example, a power supply, and output driver stage 108 can switch HS and LS transistors to convert Vin into Vout. NAND gate 104 in controller 103 can receive an enable signal EN to turn on HS transistor and NOR gate 106 in controller 103 can receive an enable signal EN_n to turn on LS transistor. Enable signals EN and EN_n can be complementary such that only one of HS and LS transistors is turned on at a time.

Output driver stage 108 can be configured to drive HS transistor ON and OFF based on output from NAND gate 104. Output driver stage 108 can be configured to drive LS transistor ON and OFF based on output from NOR gate 106. During a push phase, NAND gate 104 can output a low logic voltage level (e.g., representing logic 0) and HS transistor can be activated (e.g., closed) or turned on. Current can flow through the activated HS transistor from Vin to Vout. During push phase, LS transistor remains inactive (e.g., opened) and non-conducting such that no current flows through LS transistor. During a pull phase, NOR gate 106 can output a high logic voltage level (e.g., representing logic 1) and LS transistor can be activated (e.g., closed) or turned on. Current can flow through the activated LS transistor from Vout to ground (GND). During pull phase, HS transistor remains inactive (e.g., opened) and non-conducting such that no current flows through HS transistor.

In an aspect, drive signals being used by a push-pull driver can be pull-up signals or pull-down signals. Pull-up signals can drive the output voltage to a high level (e.g., Vin) and pull-down signals can drive the output voltage to a low level (e.g., GND). When a pull-up signal pulls the output voltage from low to high, a rising rate of the output voltage can be referred to as a rising slew rate. When a pull-down signal pulls down the output voltage from high to low, a falling rate of the output voltage can be referred to as a falling slew rate.

The rising and falling slew rates can be controlled by a controller to maintain symmetry between the rising and falling waveforms of the output voltage. Symmetry between the rising and fall waveforms can be based on a relationship between the rising slew rate and the falling slew rate. The symmetry of the rising and falling waveforms can impact the duty cycle (e.g., the ratio of the on state over a total period of the output signal). Therefore, the symmetry needs to be controlled in order to maintain the output signal at a desired duty cycle. Different data signaling systems and applications may have different desired duty cycles. By way of example, applications such as double data rate (DDR) memory interface devices may require a duty cycle of 50%.

However, slew rates can change and deviate from their predefined values based on operating conditions (e.g., data rate) and process corners (e.g., skew corners). In an aspect, process variations can cause PMOS and NMOS devices to be imbalanced and operate under different switching speed. Such imbalance can cause asymmetry in the rising and falling slew rates and asymmetrical push and pull characteristics. For example, if the PMOS device has a stronger response to the drive signal than the NMOS device, then the PMOS device can switch faster than the NMOS device and the rising slew rate can be faster than the falling slew rate. This creates an ON-OFF state asymmetry and negatively impacts duty cycle and data integrity. Further, the severity of unbalanced push-pull drivers is increased at the process corners where MOSFET skew is more prevalent. For example, at the SLOW/FAST (SF) and the FAST/SLOW (FS) corners, the strength of the PMOS and NMOS move in opposite directions. In addition to asymmetrical output signal duty cycle, MOSFET skew can reduce production yield.

To address imbalance between HS transistor and LS transistor in driver circuit 100, skew correction circuit 110 can be configured to provide HS skew parameter 112 and LS skew parameter 114 to shape waveforms of output voltage Vout. HS skew parameter 112 and LS skew parameter 122 can be bias currents or bias voltages that can provide individual skew bias correction to HS and LS transistors. Further, HS skew parameter 112 and LS skew parameter 122 can be complementary in order to counteract output skew and to achieve balanced pull-up and pull-down behaviors. As each PMOS and NMOS device of each leg among Leg-1 to Leg-N is susceptible to unique skew corner bias, each HS transistor and LS transistor in each leg of driver circuit 100 can be biased individually. The individual bias provided to individual HS transistor and LS transistor can provide skew compensation to various applications. For example, DDR memory interface transmitter designs, as well as other devices that utilizes push-pull type drivers, can use the skew compensation techniques described herein to address imbalance between pairs of power transistors.

Figure 2:
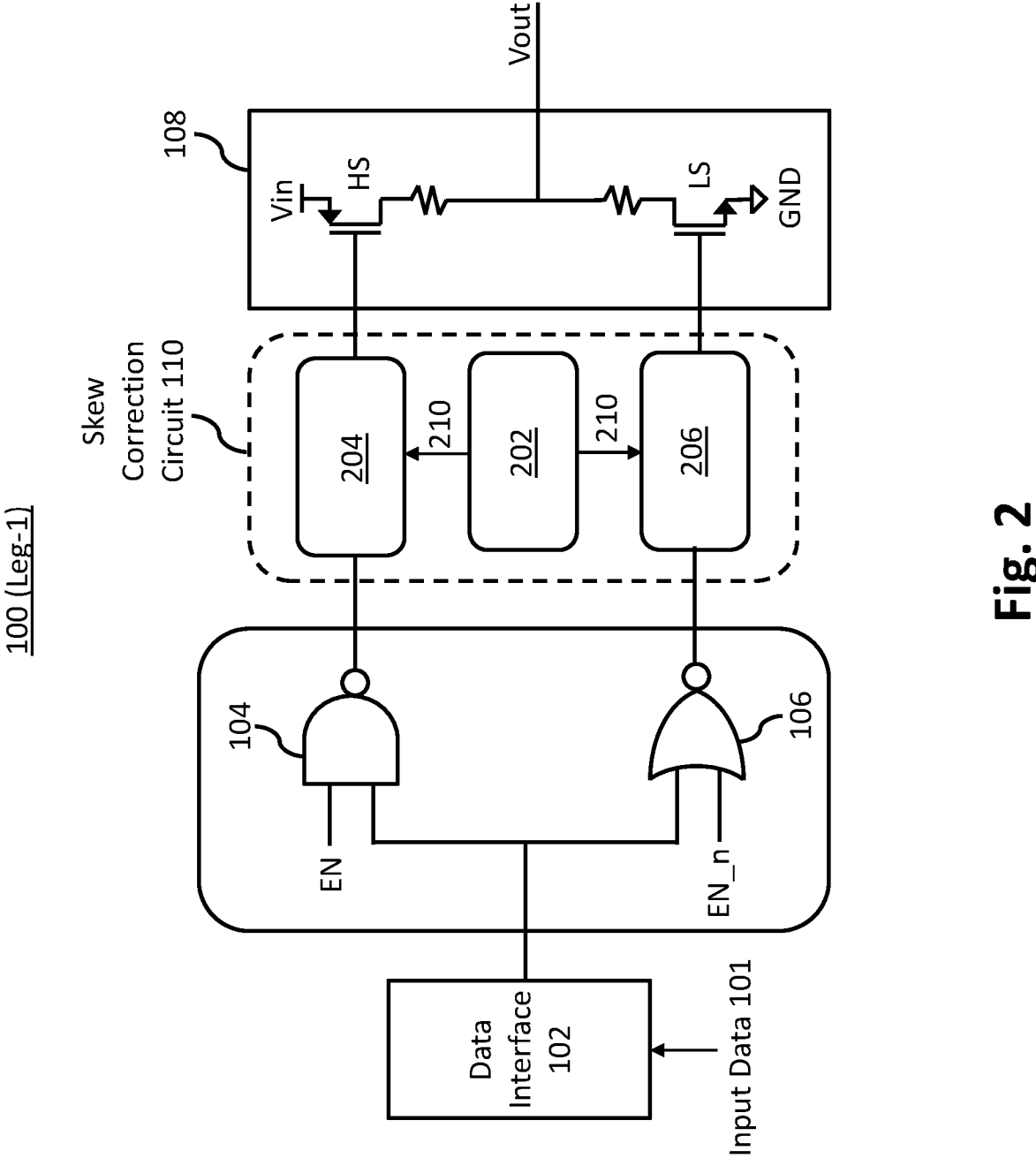
FIG. 2 is a diagram showing additional details of the apparatus of FIG. 1.

FIG. 2 is a diagram showing additional details of the apparatus of FIG. 1. Descriptions of FIG. 2 may reference components that are also shown in FIG. 1. In an example shown in FIG. 2, skew correction circuit 110 can include a skew determination circuit 202, a HS drive correction circuit 204 and a LS drive correction circuit 206. Skew determination circuit 202 can be configured to determine a skew being generated by output driver stage 108. In one embodiment, skew determination circuit 202 can include replicas of HS and LS transistors that can be used for measuring or estimating the skew being generated by output driver stage 108. Skew determination circuit 202 can output a skew measurement 210 to HS drive correction circuit 204 and LS drive correction circuit 206.

HS drive correction circuit 204 can use skew measurement 210 to generate bias current or bias voltage that can be applied to control a strength of the drive current being provided by controller 103 (or by NAND gate 104). The drive current with the applied bias current or bias voltage generated by HS drive correction circuit 204 can be used for driving HS transistor. LS drive correction circuit 206 can use skew measurement 210 to generate bias current or bias voltage that can be applied to a strength of the drive current being provided by controller 103 (or by NOR gate 106). The drive current with the applied bias current or bias voltage generated by LS drive correction circuit 206 can be used for driving LS transistor.

Figure 3:
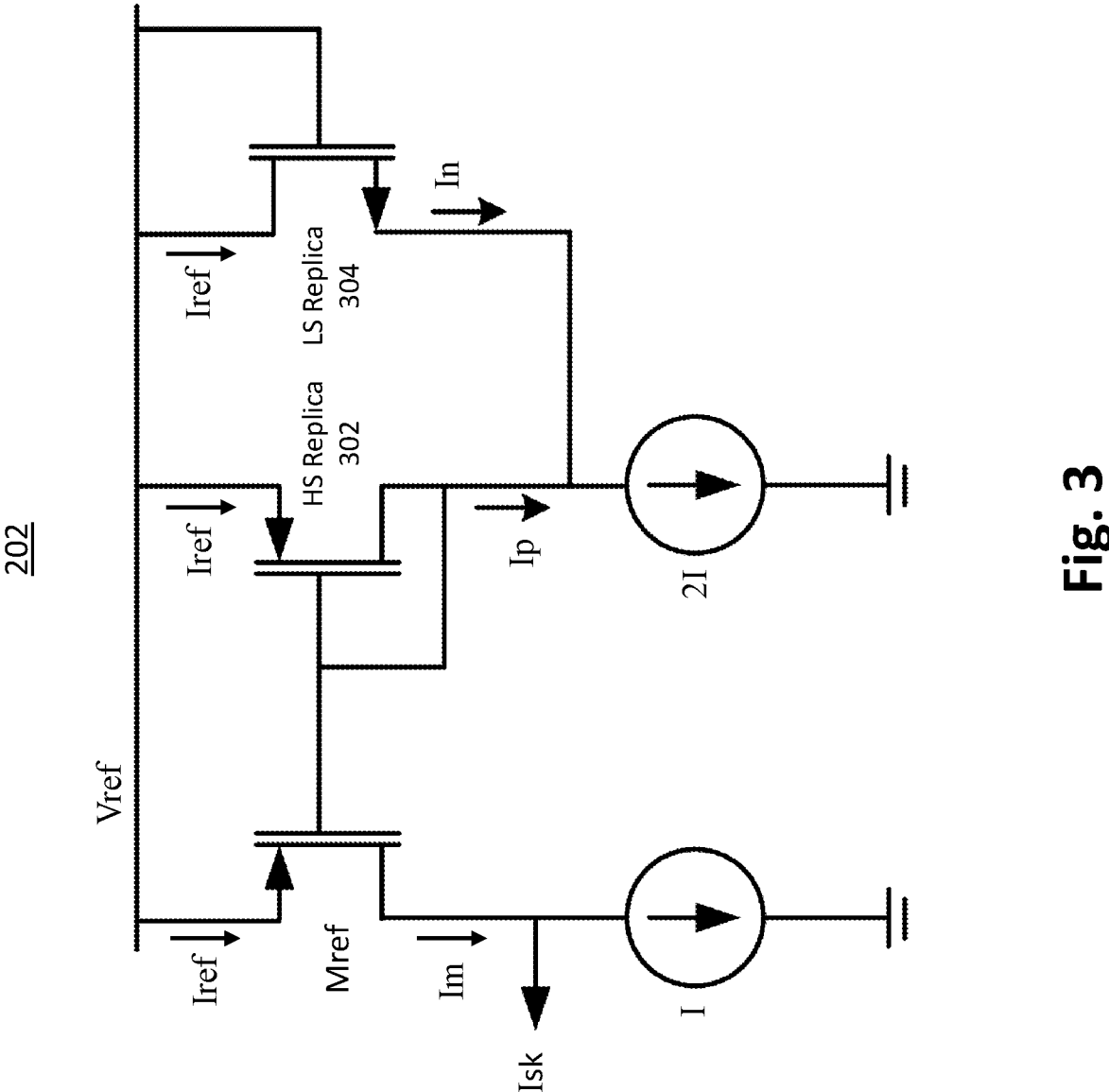
FIG. 3 is a diagram showing an example skew determination circuit that can be used for implementing skew corner driver compensation in one embodiment.

FIG. 3 is a diagram showing an example skew determination circuit that can be used for implementing skew corner driver compensation in one embodiment. Descriptions of FIG. 3 may reference components that are also shown in FIG. 1 and FIG. 2. In an embodiment shown in FIG. 3, skew determination circuit 202 can include a reference transistor Mref, a HS replica 302 and a LS replica 304. Reference transistor Mref can be a P-type MOSFET. HS replica 302 can be a P-type MOSFET that replicates HS transistor in output driver stage 108. HS replica 302 can have the same process behavior, including corner conditions, as HS transistor in output driver stage 108. LS replica 304 can be a N-type MOSFET that replicates LS transistor in output driver stage 108. LS replica 304 can have the same process behavior, including corner conditions, as LS transistor in output driver stage 108. Reference transistor Mref, HS replica 302 and LS replica 304 can form a current mirror.

The MOSFET skew of HS replica 302 and LS replica 304 can be used for generating a current division and providing a measurement of skewness that can be represented by a skew current Isk. In one embodiment, a controller (e.g., controller 103 in FIG. 1) can apply an arbitrary voltage, such as a reference voltage Vref, and each one of the reference transistor Mref, HS replica 302 and LS replica 304 can draw a current Iref from Vref. The current Iref flowing through Mref can become current Im, the current Iref flowing through HS replica 302 can become current Ip and the current Iref flowing through LS replica 304 can become current In. Current Im can be a copy of Ip as a result of arranging reference transistor Mref, HS replica 302 and LS replica 304 as a current mirror. Under an ideal situation where HS replica 302 and LS replica 304 have identical process behavior and corner conditions, currents Ip and In equivalent and an output current, which is skew current Isk, of skew determination circuit 202 can be net zero.

When HS replica 302 and LS replica 304 are imbalanced, such as having different process behavior and corner conditions, then currents Ip and In would not be equivalent and the current 2I will not be divided equally into Ip and In. Also, skew current Isk can be non-zero. The value of Isk can reflect whether HS replica 302 or LS replica 304 is the more dominant device. By way of example, if HS replica 302 is more dominant than LS replica 304, then Ip can be greater than I and In can be less than I, but a sum of Ip and In can still be 2I. Since Ip is greater than I and the path where I goes through Mref draws current I, Isk then becomes Ip-I (or I-In) and skew determination circuit 202 can push current out as skew current Isk. Isk being positive (e.g., indicating a push by skew determination circuit 202) can indicate that HS replica 302 is more dominant than LS replica 304 by a factor of Isk. Further, if HS replica 302 is more dominant than LS replica 304, then HS transistor is also more dominant than LS transistor by the same factor.

If HS replica 302 is less dominant than LS replica 304, then Ip can be less than I and In can be greater than I, but a sum of Ip and In can still be 2I. Since Ip is less than I and the path where I goes through Mref draws current I, Isk then becomes I-Ip (or In-I) and skew determination circuit 202 can pull Isk towards GND to attempt to fill up I. Isk being negative (e.g., indicating a pull by skew determination circuit 202) can indicate that HS replica 302 is less dominant than LS replica 304 by a factor of Isk. Further, if HS replica 302 is less dominant than LS replica 304, then HS transistor is also less dominant than LS transistor by the same factor. Skew current Isk can be outputted, as skew measurement 210, to HS drive correction circuit 204 and LS drive correction circuit 206 for generating bias current or bias voltage that can be used for correcting drive current being used for driving HS and LS transistors in output driver stage 108.

Figure 4:
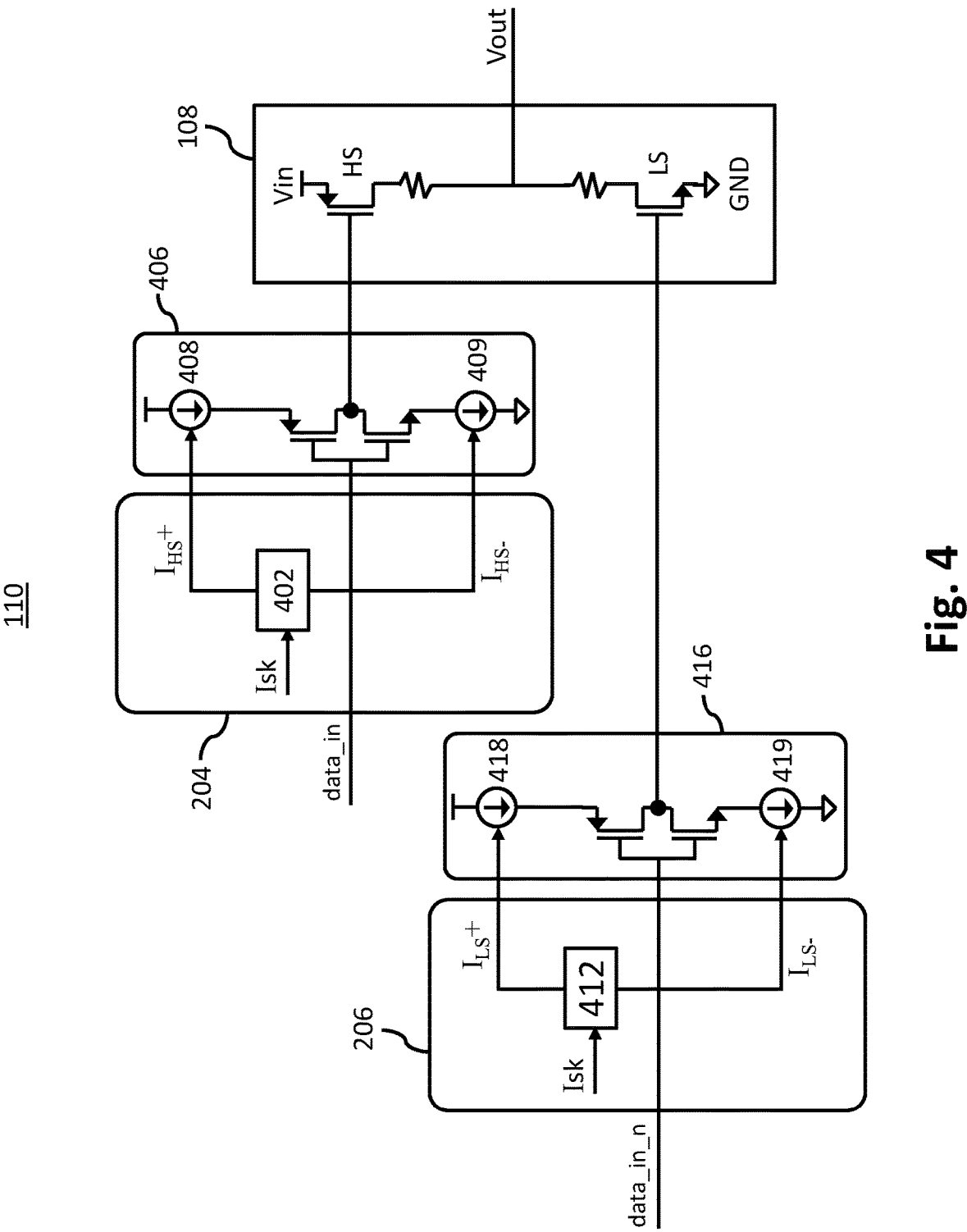
FIG. 4 is a diagram showing an example implementation of drive correction circuits that can be used in skew corner driver compensation in one embodiment.

FIG. 4 is a diagram showing an example implementation of drive correction circuits that can be used in skew corner driver compensation in one embodiment. In an embodiment shown in FIG. 4, HS drive correction circuit 204 can include a circuit 402, where circuit 402 can be a circuit configured to receive skew current Isk and use Isk to generate HS skew parameter 112 shown in FIG. 1. In the example shown in FIG. 4, circuit 402 can generate HS skew parameter 112 that includes bias currents, such as complementary correction currents $I_{HS+}$ and $I_{HS-}$. The complementary correction currents $I_{HS+}$ and $I_{HS-}$ can be applied to a current mode pre-driver 406 to control strengths of pre-driver current sources 408, 409. An output of current mode pre-driver 406 can be dependent on the data_in signal that can be provided by, for example, NAND gate 104 in controller 103 shown in FIG. 1. Changes to strengths of pre-driver current sources 408, 409 can change the drive strength of current mode pre-driver 406. Changes to the drive strength of current mode pre-driver 406 can change the speed of turning on and turning off HS transistor, thus changing the rising slew rate of Vout.

Similarly, in the embodiment shown in FIG. 4, LS drive correction circuit 206 can include a circuit 412, where circuit 412 can be a circuit configured to receive skew current Isk and use Isk to generate LS skew parameter 114 shown in FIG. 1. In the example shown in FIG. 4, circuit 412 can generate LS skew parameter 114 that includes bias currents, such as complementary correction currents $I_{LS+}$ and $I_{LS-}$. The complementary correction currents $I_{LS+}$ and $I_{LS-}$ can be applied to a current mode pre-driver 416 to control strengths of pre-driver current sources 418, 419. Changes to strengths of pre-driver current sources 418, 419 can change a drive strength of current mode pre-driver 416. An output of current mode pre-driver 416 can be dependent on the data_in_n signal that can be provided by, for example, NOR gate 106 in controller 103 shown in FIG. 1. The signals data_in and data_in_n can be complementary. Changes to the drive strength of current mode pre-driver 416 can change a speed of turning on and turning off LS transistor, thus changing the falling slew rate of Vout.

By way of example, if HS replica 302 is more dominant than LS replica 304 (or HS transistor is more dominant than LS transistor), then skew determination circuit 202 can push skew current Isk to circuit 402 and circuit 402 can receive or see Isk that has a positive value. In response to Isk having a positive value, circuit 402 can set complementary correction currents $I_{HS+}$ and $I_{HS-}$ to adjust pre-driver current sources 408, 409 to reduce a transition speed of HS transistor from an OFF state to an ON state by a factor of Isk. With respect to LS transistor, skew determination circuit 202 can push skew current Isk to circuit 412 and circuit 412 can receive or see Isk that has a positive value. In response to Isk having a positive value, circuit 412 can set complementary correction currents $I_{LS+}$ and $I_{LS-}$ to adjust pre-driver current sources 418, 419 to increase a transition speed of LS transistor from an ON state to an OFF state by a factor of Isk.

If HS replica 302 is less dominant than LS replica 304 (or HS transistor is less dominant than LS transistor), then skew determination circuit 202 can pull skew current Isk from circuit 402 and circuit 402 can receive or see Isk that has a negative value. In response to Isk having a negative value, circuit 402 can set complementary correction currents $I_{HS+}$ and $I_{HS-}$ to adjust pre-driver current sources 408, 409 to increase a transition speed of HS transistor from an OFF state to an ON state by a factor of Isk. With respect to LS transistor, skew determination circuit 202 can pull skew current Isk from circuit 412 and circuit 412 can receive or see Isk that has a negative value. In response to Isk having a negative value, circuit 412 can set complementary correction currents $I_{LS+}$ and $I_{LS-}$ to adjust pre-driver current sources 418, 419 to decrease a transition speed of LS transistor from an ON state to an OFF state by a factor of Isk.

Therefore, when HS transistor is more dominant, the rising slew rate of output driver stage 108 can be decreased and the falling slew rate of output driver stage 108 can be increased by the same factor Isk to achieve a desired duty cycle (e.g., 50% for DDR memory applications). When HS transistor is less dominant, the rising slew rate of output driver stage 108 can be increased and the falling slew rate of output driver stage 108 can be decreased by the same factor Isk to achieve a desired duty cycle.

Figure 5:
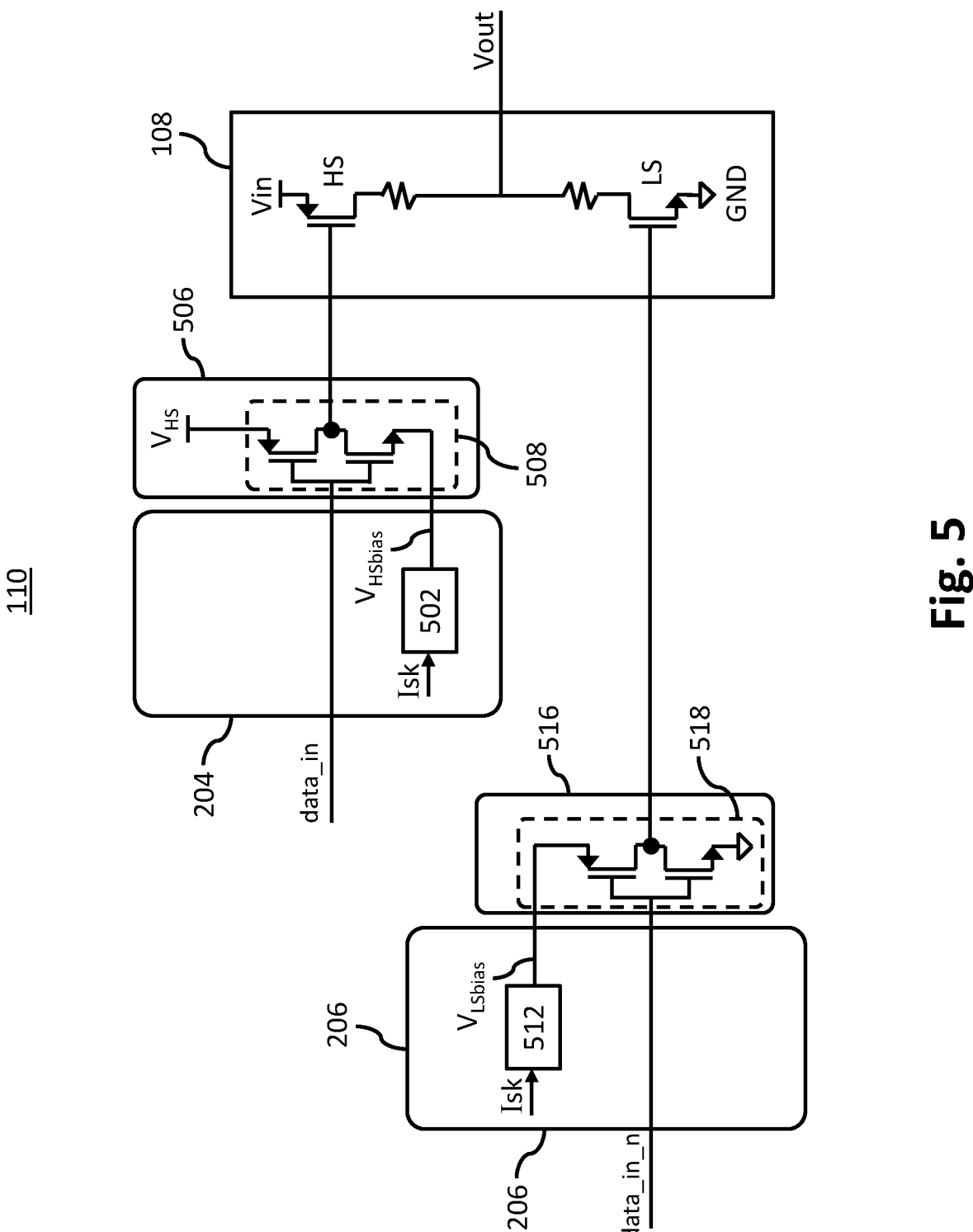
FIG. 5 is a diagram showing another example implementation of drive correction circuits that can be used in skew corner driver compensation in one embodiment.

FIG. 5 is a diagram showing another example implementation of drive correction circuits that can be used in skew corner driver compensation in one embodiment. In an embodiment shown in FIG. 5, HS drive correction circuit 204 can include a voltage control circuit 502 ("circuit 502"). Voltage control circuit 502 can be a circuit configured to control a voltage level of a voltage mode pre-driver 506. Circuit 502 can receive skew current Isk and use Isk to determine HS skew parameter 112 shown in FIG. 1. In the example shown in FIG. 5, HS skew parameter 112 can include parameters, such as a bias voltage $V_{HSbias}$, to adjust drive voltage levels being used for driving HS transistor. In the embodiment shown in FIG. 5, circuit 502 can use Isk to change the output of a complementary metal-oxide semiconductor (CMOS) inverter 508 in voltage mode pre-driver 506. The output of CMOS inverter 508 can be dependent on the data_in signal that can be provided by, for example, NAND gate 104 in controller 103 shown in FIG. 1.

If circuit 502 is disabled and data_in is high voltage (e.g., voltage representing logic one or high logic), then CMOS inverter 508 will register a low voltage output (e.g., voltage representing logic zero or low logic) or 0V. If circuit 502 is enabled and data_in is high voltage, then CMOS inverter 508 will output a low voltage, which can be $V_{Hsbias}$ in this embodiment. The output level, $V_{Hsbias}$, can be adjusted by Isk via circuit 502. The adjustment to the output level of CMOS inverter 508 can adjust the drive strength of HS transistor, affecting the rising slew rate of Vout.

Further, in the embodiment shown in FIG. 5, LS drive correction circuit 206 can include a voltage control circuit 512 ("circuit 512"). Voltage control circuit 512 can be a circuit configured to control a voltage level of a voltage mode pre-driver 516. Circuit 512 can receive skew current Isk and use Isk to determine LS skew parameter 114 shown in FIG. 1. In the example shown in FIG. 5, LS skew parameter 114 can include parameters, such as a bias voltage $V_{Lsbias}$, to adjust drive voltage levels being used for driving LS transistor. In the embodiment shown in FIG. 5, circuit 512 can use Isk to change the output of a CMOS inverter 518 in voltage mode pre-driver 516. The output of CMOS inverter 518 can be dependent on the data_in_n signal that can be provided by, for example, NOR gate 106 in controller 103 shown in FIG. 1.

If circuit 512 is disabled and data_in_n is low voltage, then CMOS inverter 518 will output a high voltage (e.g., voltage representing logic one or high logic) . . . . If circuit 512 is enabled and data_in_n is low voltage, then CMOS inverter 518 will output a high voltage, which can be $V_{Lsbias}$ in this embodiment. The output level, $V_{Lsbias}$, can be adjusted by Isk via circuit 512. The adjustment to the output level of CMOS inverter 518 can adjust the drive strength of LS transistor, affecting the falling slew rate of Vout.

If Isk indicates that the HS transistor is more dominant, then circuit 502 can remain disabled but circuit 512 can be enabled to increase the falling slew rate of output driver stage 108. If Isk indicates that the HS transistor is less dominant, then circuit 512 can remain disabled but circuit 502 can be enabled to increase the rising slew rate of output driver stage 108. The adjustment to the rising and falling slew rates can be based on the same factor of Isk.

FIG. 6 is a flowchart of an example process that can implement skew corner driver compensation in one embodiment. A process 600 in FIG. 6 may be implemented using, for example, apparatus 100 discussed above. Process 600 can include one or more operations, actions, or functions as illustrated by one or more of blocks 602, 604, 606, 608, and/or 610. Although illustrated as discrete blocks, various blocks may be divided into additional blocks, combined into fewer blocks, eliminated, performed in different order, or performed in parallel, depending on the desired implementation.

Process 600 can be performed by a driver circuit, such as a push-pull driver (driver circuit 100 described herein). Process 600 can begin at block 602, where the driver circuit can determine a skew measurement of an output driver stage of a driver circuit. The process 600 can continue from block 602 to block 604. At block 604, the driver circuit can determine a first skew parameter based on the skew measurement. The process 600 can continue from block 604 to block 606. At block 606, the driver circuit can apply a first bias that can be dependent on the skew measurement to drive a high-side transistor of the output driver stage. The process 600 can continue from block 606 to block 608. At block 608, the driver circuit can determine a second skew parameter based on the skew measurement. The process 600 can continue from block 608 to block 610. At block 610, the driver circuit can apply a second bias that can be dependent on the skew measurement to drive a low-side transistor of the output driver stage. The first bias and the second bias can be complementary.

In one embodiment, the skew measurement can indicate an imbalance between a replica of the high-side transistor and a replica of the low-side transistor. In another embodiment, the driver circuit 100 can determine the skew measurement by applying reference current to a current mirror formed by at least a replica of the high-side transistor and a replica of the low-side transistor. The driver circuit can further obtain an output of the current mirror that represents the skew measurement. In another embodiment, the driver circuit can apply the first bias to a first pre-driver configured to drive the high-side transistor and can further apply the second bias to a second pre-driver configured to drive the low-side transistor. In another embodiment, the driver circuit can apply the first bias by applying a first bias current to adjust a current source of a first current mode pre-driver configured to drive the high-side transistor. The driver circuit can further apply the second bias by applying a second bias current to adjust a current source of a second current mode pre-driver configured to drive the low-side transistor. In another example, the driver circuit can apply the first bias by applying a first bias voltage to adjust a drive voltage being outputted by a first current mode pre-driver configured to drive the high-side transistor. The driver circuit can further apply the second bias by applying a second bias voltage to adjust a drive voltage being outputted by a second voltage mode pre-driver configured to drive the low-side transistor.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a first circuit configured to output a skew measurement of an output driver stage in a driver circuit;
a second circuit configured to:
  determine a first skew parameter based on the skew measurement; and
  apply a first bias that is dependent on the skew measurement to drive a high-side transistor in the output driver stage; and
a third circuit configured to:
  determine a second skew parameter based on the skew measurement; and
  apply a second bias that is dependent on the skew measurement to drive a low-side transistor in the output driver stage, wherein the first bias and the second bias are complementary,
wherein:
  the first circuit comprises a replica of the high-side transistor and a replica of the low-side transistor; and
  the skew measurement indicates an imbalance between the replica of the high-side transistor and the replica of the low-side transistor.

2. The semiconductor device of claim 1, wherein:
the first circuit comprises a current mirror formed by at least a replica of the high-side transistor and a replica of the low-side transistor; and the skew measurement represents an output current of the current mirror.

3. The semiconductor device of claim 1, further comprising:
a first pre-driver configured to drive the high-side transistor;
a second pre-driver configured to drive the low-side transistor;
the second circuit is configured to apply the first bias to the first pre-driver; and
the third circuit is configured to apply the second bias to the second pre-driver.

4. The semiconductor device of claim 3, wherein:
the first pre-driver is a first current mode pre-driver;
a second pre-driver is a second current mode pre-driver;
the first bias is a first bias current;
the second bias is a second bias current;
the second circuit is configured to apply the first bias current to adjust a current source of the first current mode pre-driver; and
the third circuit is configured to apply the second bias current to adjust a current source of the second current mode pre-driver.

5. The semiconductor device of claim 3, wherein:
the first pre-driver is a first voltage mode pre-driver;
a second pre-driver is a second voltage mode pre-driver;
the first bias is a first bias voltage;
the second bias is a second bias voltage;
the second circuit is configured to apply the first bias voltage to adjust a drive voltage being outputted by the first voltage mode pre-driver; and
the third circuit is configured to apply the second bias voltage to adjust a drive voltage being outputted by the second voltage mode pre-driver.

6. The semiconductor device of claim 1, wherein the drive circuit is a push-pull driver.

7. An apparatus comprising:
a controller configured to receive an input signal;
an output driver stage comprising a high-side transistor and a low-side transistor, the output driver stage being configured to switch the high-side transistor and the low-side transistor to output an output voltage that represents the input signal; and
a circuit configured to:
  determine a skew measurement of the output driver stage;
  determine a first skew parameter based on the skew measurement;
  apply a first bias that is dependent on the skew measurement to drive the high-side transistor;
  determine a second skew parameter based on the skew measurement; and
  apply a second bias that is dependent on the skew measurement to drive the low-side transistor, wherein the first bias and the second bias are complementary,
wherein:
  the circuit comprises a replica of the high-side transistor and a replica of the low- side transistor; and
  the skew measurement indicates an imbalance between the replica of the high-side transistor and the replica of the low-side transistor.

8. The apparatus of claim 7, wherein:
the circuit comprises a current mirror formed by at least a replica of the high-side transistor and a replica of the low-side transistor; and the skew measurement represents an output current of the current mirror.

9. The apparatus of claim 7, further comprising:
a first pre-driver configured to drive the high-side transistor;
a second pre-driver configured to drive the low-side transistor,
wherein the circuit is configured to:
apply the first bias to the first pre-driver; and
apply the second bias to the second pre-driver.

10. The apparatus of claim 9, wherein:
the first pre-driver is a first current mode pre-driver configured to drive the high-side transistor;
a second pre-driver is a second current mode pre-driver configured to drive the low-side transistor;
the first bias is a first bias current;
the second bias is a second bias current; and
the circuit is configured to:
apply the first bias current to adjust a current source of the first current mode pre-driver; and
apply the second bias current to adjust a current source of the second current mode pre-driver.

11. The apparatus of claim 9, wherein:
the first pre-driver is a first voltage mode pre-driver configured to drive the high-side transistor;
a second pre-driver is a second voltage mode pre-driver configured to drive the low-side transistor;
the first bias is a first bias voltage;
the second bias is a second bias voltage; and
the circuit is configured to:
apply the first bias voltage to adjust a drive voltage being outputted by the first voltage mode pre-driver; and
apply the second bias voltage to adjust a drive voltage being outputted by the second voltage mode pre-driver.

12. The apparatus of claim 7, wherein the controller, the output driver stage and the circuit are parts of a push-pull driver.

13. A method for operating a driver circuit, the method comprising:
determining a skew measurement of an output driver stage of a driver circuit;
determining a first skew parameter based on the skew measurement;

applying a first bias that is dependent on the skew measurement to drive a high-side transistor of the output driver stage;
determining a second skew parameter based on the skew measurement; and
applying a second bias that is dependent on the skew measurement to drive a low-side transistor of the output driver stage, wherein:
the first bias and the second bias are complementary; and
the skew measurement indicates an imbalance between a replica of the high-side transistor and a replica of the low-side transistor.

14. The method of claim 13, wherein determining the skew measurement comprises:
applying reference current to a current mirror formed by at least a replica of the high-side transistor and a replica of the low-side transistor; and
obtaining an output of the current mirror that represents the skew measurement.

15. The method of claim 13, further comprising:
applying the first bias to a first pre-driver configured to drive the high-side transistor; and
applying the second bias to a second pre-driver configured to drive the low-side transistor.

16. The method of claim 13, wherein:
applying the first bias comprises applying a first bias current to adjust a current source of a first current mode pre-driver configured to drive the high-side transistor; and
applying the second bias comprises applying a second bias current to adjust a current source of a second current mode pre-driver configured to drive the low-side transistor.

17. The method of claim 13, wherein:
applying the first bias comprises applying a first bias voltage to adjust a drive voltage being outputted by a first current mode pre-driver configured to drive the high-side transistor; and
applying the second bias comprises applying a second bias voltage to adjust a drive voltage being outputted by a second voltage mode pre-driver configured to drive the low-side transistor.

* * * * *